US006836121B2

(12) United States Patent
Barbour et al.

(10) Patent No.: US 6,836,121 B2
(45) Date of Patent: Dec. 28, 2004

(54) APPARATUS FOR CONTROLLING A MAGNETICALLY ACTUATED POWER SWITCHING DEVICE AND METHOD OF CONTROLLING THE SAME

(75) Inventors: Erskine R. Barbour, Benson, NC (US); Carl J. LaPlace, Raleigh, NC (US)

(73) Assignee: ABB Inc., Raleigh, NC (US)

( * ) Notice: Subject to any disclaimer, the term of this patent is extended or adjusted under 35 U.S.C. 154(b) by 0 days.

(21) Appl. No.: 09/875,059

(22) Filed: Jun. 6, 2001

(65) Prior Publication Data

US 2002/0186015 A1 Dec. 12, 2002

(51) Int. Cl.[7] ........................ G01R 33/02; G01R 31/02; G01R 31/327

(52) U.S. Cl. ........................ 324/418; 324/256; 324/424; 361/168.1; 361/169.1

(58) Field of Search ................................ 324/418, 263, 324/256, 257, 424, 388; 361/113, 115, 160, 168.1, 169.1, 191

(56) References Cited

U.S. PATENT DOCUMENTS 5,452,172 A * 9/1995 Lane et al. .................... 361/71
5,729,119 A * 3/1998 Barbour ....................... 323/222
5,808,471 A * 9/1998 Rooke et al. ............... 324/418
5,907,467 A * 5/1999 Barbour ....................... 361/170
6,147,422 A * 11/2000 Delson et al. .......... 273/148 R
6,175,456 B1 * 1/2001 Yun ............................ 360/46
6,208,497 B1 * 3/2001 Seale et al. ................. 361/154
6,291,911 B1 * 9/2001 Dunk et al. ................. 307/137

OTHER PUBLICATIONS

ABB Brochure, VR–3S Recloser 15–38kV, Distribution Automation Equipment Division, Descriptive Bulletin 38–741–27, Jun. 1999.

* cited by examiner

*Primary Examiner*—Anjan Deb
*Assistant Examiner*—John Teresinski
(74) *Attorney, Agent, or Firm*—Woodcock Washburn LLP

(57) ABSTRACT

A power switching control device and methods for using the same to control a magnetic actuator within a power switching device are disclosed. The power switching control device uses a series of modulated current pulses to control a magnetic actuator within a power switching device. The power switching control device inputs a power signal and applies a series of modulated current pulses through the coil of the magnetic actuator in a first direction such that the actuator moves from a first position to a second position. Certain operating characteristics of a power switching device can be ascertained by analyzing the impedance of the magnetic actuator coil within the power switching device. The power switching device control device also has an improved energy management system therein. In this manner, the controller includes a voltage regulator that has the ability to switch between operating modes.

18 Claims, 6 Drawing Sheets

APPARATUS FOR CONTROLLING A MAGNETICALLY ACTUATED POWER SWITCHING DEVICE AND METHOD OF CONTROLLING THE SAME

FIELD OF THE INVENTION

The present invention relates in general to the field of electrical power distribution systems. More particularly, the present invention relates to power switching control devices as used in electrical power distribution systems.

BACKGROUND OF THE INVENTION

A common problem in almost any electrical power distribution system is a momentary disruption of electrical service or faults, such as might be caused by a momentary short circuit. Most of these faults are self correcting and do not require permanent fuse or circuit breaker protection because they terminate quickly. If a fuse should burn out or a circuit breaker should trip, however, the power line would be open and customers would be deprived of their electrical power. Service calls to replace fuses or reset circuit breakers would then be required, thus escalating the customer's costs.

A power switching device system is a fault-interrupting device used to sense current, voltage, and/or frequency variations and isolate faulted portions of distribution feeders thereby protecting power lines in an electrical power distribution system. More particularly, power switching device systems. generally, include a power switching device and a power switching control device. The power switching device may be an electromechanical device, similar to a circuit breaker that includes a magnetic actuator or magnetic latch for opening and closing each line of a power system.

A magnetic actuator may a solenoid that magnetically latches when energized with the proper polarity of direct current (DC). One type of magnetic actuator is the single-coil design. To operate a single-coil magnetic actuator, the current flows in one direction for a latch (close) function and in the opposite direction for the unlatch (open) function. Each power switching device has three magnetic actuators (one for each phase of AC power) and each magnetic actuator is mechanically connected to a vacuum switch. Presently, each magnetic actuator requires about 20 amps to complete a latch (close) operation and about 10 amps to release.

When a power switching control device senses a fault condition in a power line, the power switching control device opens the magnetic actuator. By opening the magnetic actuator, the power switching device interrupts the power flow to the remaining portion of the distribution system, i.e. clears the fault from the remaining portion of the system.

If the fault has not cleared itself during a fixed time interval, then, as the name suggests, the power switching control device will reclose the magnetic actuator, and if the fault condition has been cleared, power service will resume. If, however, the fault condition has not been cleared, the power switching device will again trip open the magnetic actuator after a second fixed time interval. If, after a predetermined number of reclose operations, and the fault condition has not been cleared, the power switching control device will permanently lockout the magnetic actuator permanently open the circuit). The circuit then remains open until the system is repaired and/or the fault condition is eliminated. An exemplary power switching device for use with the present invention is the VR-3S recloser manufactured and distributed by ABB Power T&D Company, Inc., Raleigh, N.C.

A power switching device is operated by a power switching control device (controller). Typically, the controller is an electronic control circuit that provides the intelligence that enables a power switching device to sense overcurrents, select timing operations, and time the reclosing functions. The controller is a microprocessor-based device that includes software and hardware components for controlling the operation of the power switching device. The hardware, or physical elements, are the integrated circuits, resistors, capacitors, displays, switches, and so forth. The software is the coded instructions that the microprocessor uses to control the power switching device.

A conventional controller contains various components. For example, a power supply is typically provided in a controller and provides power to other components of the controller. A voltage regulator may also be used in a controller to provide a stabilized input signal to various components in the controller. Storage or memory may also be provided for temporarily and/or permanently storing data and/or software for the controller. For use with a power switching device, for example, this data would include line current magnitudes and command information such as multiple time-current characteristic curves and protection setting groups. The memory can be random access memory (RAM) or read only memory (ROM) or any other type of memory. ROM is preferably electrically programmable for easy modification and is used for storing programming information. The storage can be internal to the controller or external to the controller.

A controller may also include a display for displaying information and a keyboard or other input device may be used for entering information. Indicator lamps provide status information such as power switching device open, power switching device closed, control lock out, above minimum trip, malfunction and lock in, An exemplary controller unit is the PCD2000 manufactured and distributed by ABB Power T&D Company, Inc., Raleigh, N.C.

Typically, a controller controls (e.g. opens and closes) the position of magnetic actuator in a power switching device by applying a voltage across the coils in the magnetic actuator. As such, when a certain amount of voltage is applied, the actuator will open or close, thus opening or closing an associated power line. However, such a method of opening and closing a magnetic actuator oftentimes wastes energy and does not provide the ability to control the speed at which the actuators open or close. Therefore, a need exists for power switching control device that efficiently and effectively controls a magnetic actuator in a power switching device.

BRIEF SUMMARY OF THE INVENTION

The present invention satisfies the aforementioned need by providing a power switching control device and methods for using the same to control a magnetic actuator within a power switching device using a series of modulated current pulses. In one embodiment of the present invention, the modulated current pulses are tunable and, as such, enables the control device to be compatible with multiple types of actuators each having various impedance characteristics. Also, a power switching control device in accordance with the present invention may control the speed at which the magnetic actuator opens and closes.

According to one embodiment of the present invention, a method is provided for controlling a magnetic actuator within a power switching device including a magnetic actuator having a coil and an armature. In this manner, a series of modulated current pulses is applied through the coil of the magnetic actuator in a first direction such that the actuator moves from a first position to a second position and a series of modulated current pulses is applied through the coil of the magnetic actuator in a second direction such that the actuator moves from the second position to the first position.

In one embodiment of the present invention, certain operating characteristics of a power switching device can be ascertained by analyzing the impedance of the magnetic actuator coil within the power switching device. As such, the position of the magnetic actuator may be determined within the power switching device. Alternatively, in another embodiment of the present invention, the physical condition of the magnetic actuator coil is determined.

Additionally and in another embodiment of the present invention, a power switching device control device is provided having an improved energy management system therein. In this manner, the controller includes a voltage regulator that has the ability to switch between operating modes.

BRIEF DESCRIPTION OF THE SEVERAL VIEWS OF THE DRAWING

Other features of the present invention are further apparent from the following detailed description of the embodiments of the present invention taken in conjunction with the accompanying figures, of which.

DETAILED DESCRIPTION OF THE INVENTION

The present invention provides a power switching control device and methods for using the same to control a magnetic actuator within a power switching device. In this manner, the power switching control device, in accordance with the present invention, is adapted to provide a series of modulated current pulses to control (e.g. to open and close) a magnetic actuator within a power switching device. A magnetic actuator is controlled within a power switching device by using a series of modulated current pulses. In one embodiment of the present invention, the power switching control device is a recloser controller and the power switching device is a recloser.

Additionally, in one embodiment of the present invention, certain operating characteristics of a magnetic actuator can be ascertained in a power switching device by viewing the impedance of the magnetic actuator coil. In this manner, the position of an armature in a magnetic actuator can be determined. Alternatively, the physical condition of the magnetic actuator coil can be determined. Additionally, in yet another embodiment of the present invention, the power switching control device includes a regulator having the ability to switch between a switching mode and a linear mode.

Figure 1:
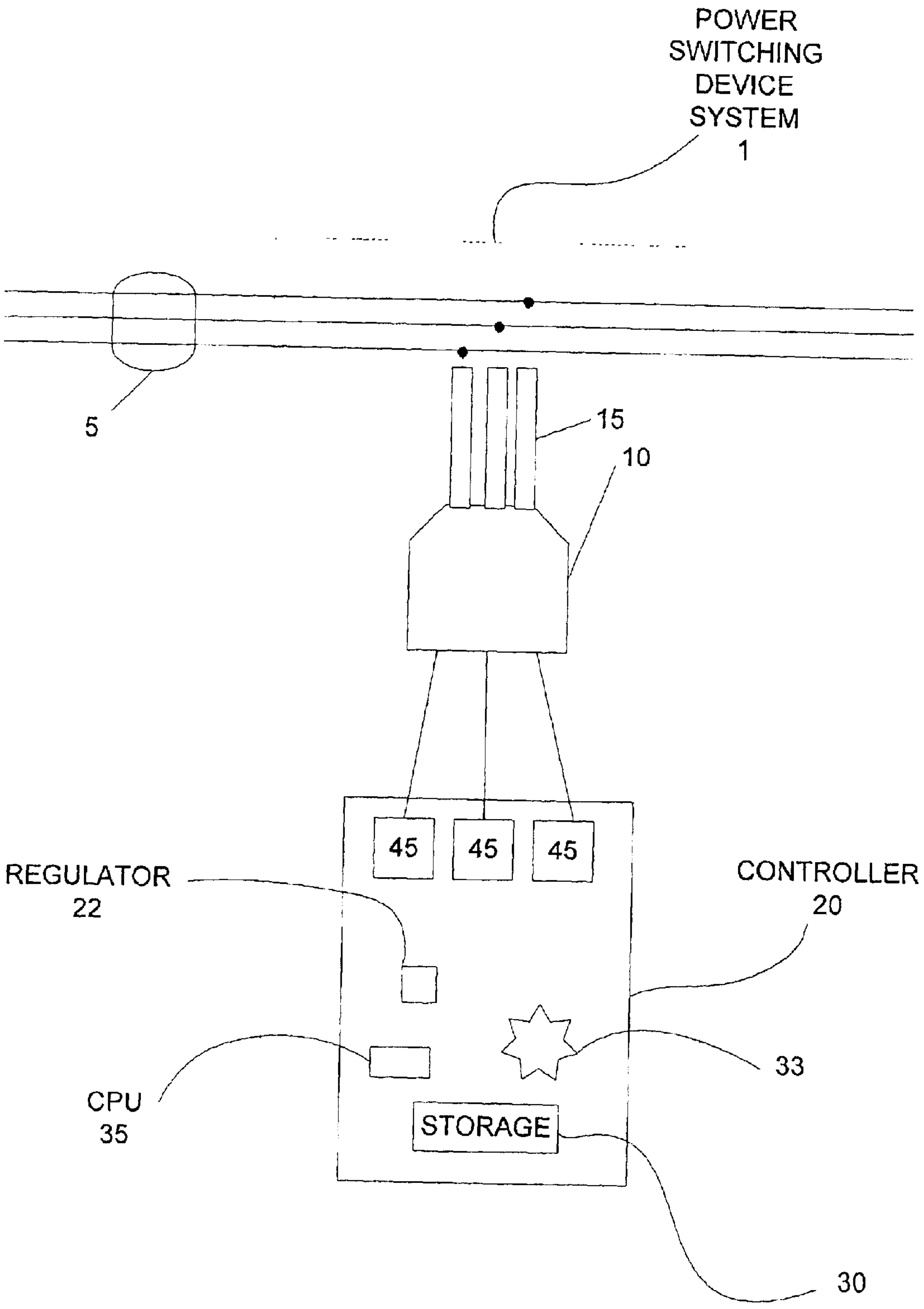
FIG. 1 is a simplified schematic diagram of a power switching device system including a power switching control device in accordance with the present invention and a power switching device.

FIG. 1 is a simplified schematic diagram of a power switching device system 1 in which the present invention may be embodied. A power switching device system 1 includes a power switching device 10 and a power switching device controller 20 in accordance with the present invention. The power switching device 10 is coupled to a power line 5 (e.g., between a substation and a load), and is operated by a power switching device control device 20 such as a recloser control device. The power line 5 is a three-phase power line. The power switching device 10 comprises three poles or magnetic actuators 15. Each magnetic actuator 15 is connected to an associated wire on the power line 5, thereby being energized by an associated phase.

Power switching device controller 20 comprises storage device 30 for storing power switching device operating parameters or the like and regulator 22 (described further below with respect to FIGS. 5A and 5B. Regulator 22 maintains a constant output voltage even when an input voltage fluctuates. In one embodiment of the present invention, the regulator 22 has the ability to operate in a linear mode, a switching mode or both modes simultaneously. The regulator 22 in accordance with the present invention also has the ability to deliver to a load several amps for several seconds and the ability to maintain regulation over a wide range of input voltage.

The power switching control device also includes a microprocessor or CPU 35 and at least one actuator drive circuit 45. The actuator drive circuits 45 are each connected to and control (e.g. open and close) a magnetic actuator in the power switching device 10. In accordance with the present invention, the actuator drive circuits are adapted to provide a series of modulated current pulses to the magnetic actuator within the power switching device. In one embodiment of the present invention, there are three actuator drive circuits located in a recloser control device each associated with a magnetic actuator in a power switching device such as recloser. As such, each actuator drive circuit uses a pulse width modulator from CPU 35 to deliver a series of tunable modulated current pulses to the magnetic actuator (not shown) in power switching device 10, such as, for example, a recloser, to open and close the magnetic actuator.

In this manner, the current pulses may be tunable by adjusting the magnitude and duration of each pulse as to open and close the magnetic actuator. By adjusting the magnitude and duration of the current pulse delivered to the magnetic actuator, the power switching control device becomes widely compatible with a variety of actuators having difference impedance characteristics because actuators having different impedances require different current magnitudes and durations in order to open and close the actuator. In one embodiment of the present invention, the power switching control device, has a low, medium and high setting for adjusting the magnitude of the current pulses such that a variety of magnetic actuators may be controlled by the power switching control device. For example, the low setting may deliver a current pulse of 10 amps, the medium setting 20 amps and the high setting 30 amps.

In one embodiment of the present invention, the actuator drive circuits 45 are powered by a power supply 33 that is programmable from about 150 VDC to about 250VDC, however, power supply 33 may be a direct current or alternating current supply without departing from the scope of the present invention.

Figure 2:
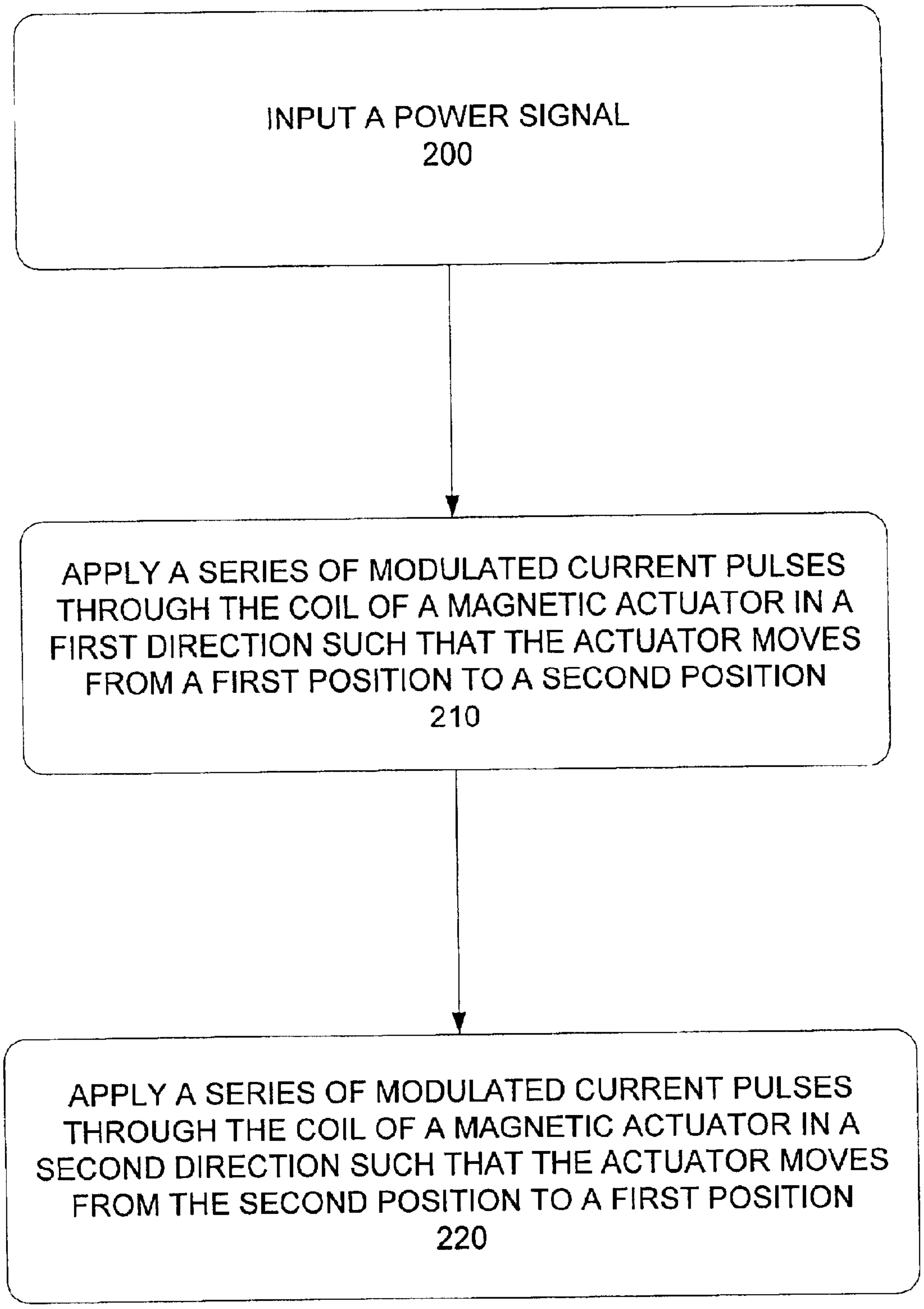
FIG. 2 is a flowchart of an exemplary method of controlling a power switching device in accordance with the present invention.

FIG. 2 is a flowchart of an exemplary method of controlling a magnetic actuator within a power switching device 10, which may be a recloser, for example, in accordance with the present invention. In the method, a magnetic actuator having a coil and an armature within a power switching device is controlled by a power switching control device. In particular, an input signal is inputted at step 200 and a series of modulated current pulses are applied through the coil of the magnetic actuator in a first direction such that the actuator moves from a first position to a second position (e.g. open to close) at step 210. In another embodiment of the present invention, a series of modulated current pulses is applied through the coil of the magnetic actuator in a second direction such that the actuator moves from the second position to a third position at step 220. For example, the third position may be the first position. In this manner, the magnetic actuator may move from an open position (first position) to a closed position (second position) and back to the open position (first position).

Additionally, in another embodiment of the present invention, while pulsing the actuator coil with a series of modulated current pulses, a current value is measured in the coil and such a current value is compared with a threshold or regulation value. In this manner, the threshold value may represent a current value at which the actuator drive will stop delivering current pulses to the magnetic actuator. In this regard, if the current value in the coil is determined to be less than the threshold value than the actuator drive coil will continue to send current pulses to the magnetic actuator, however, if the current value is determined to be greater than or equal to the threshold value than the actuator drive circuit will cease to deliver current pulses to the magnetic actuator.

Furthermore, in yet another embodiment of the invention, the series of modulated current pulses that are applied to the actuator coil are tunable. In this manner, the amplitude and duration of the modulated current pulses are tunable, and, as such, the power switching control device may control a variety of magnetic actuators.

Figure 3A:
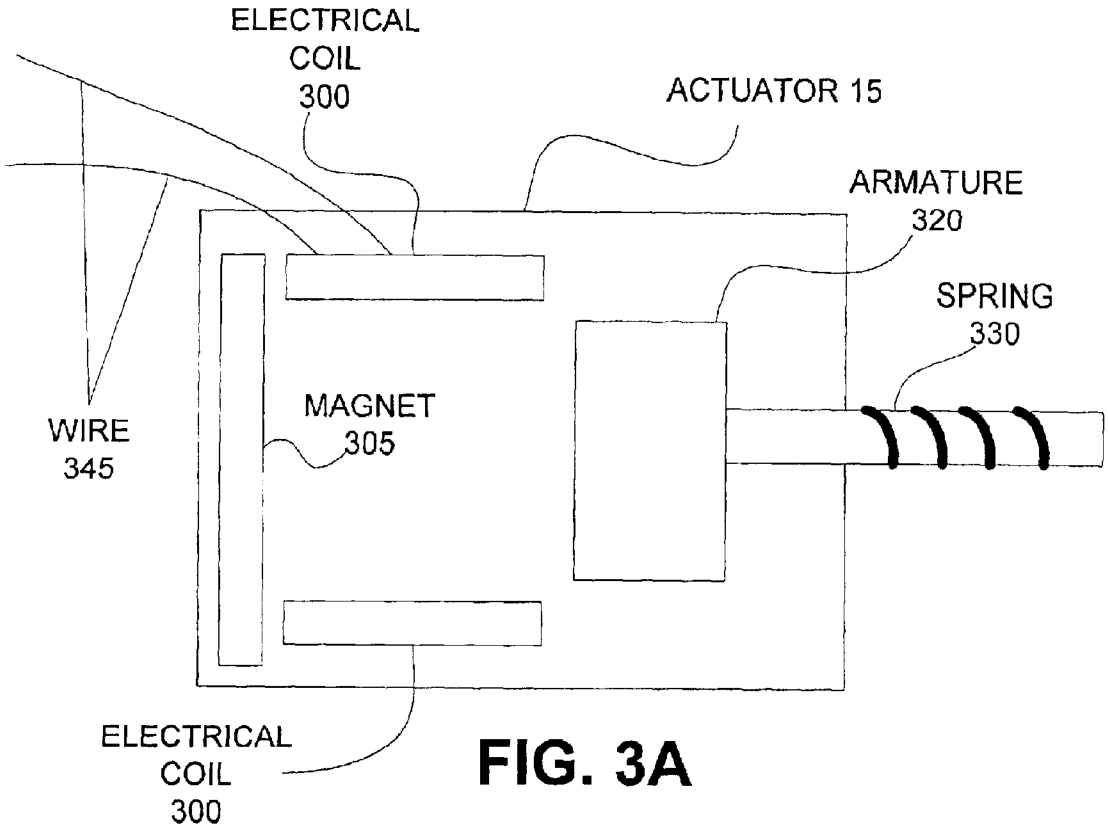
FIGS. 3A and 3B are block diagrams of a magnetic actuator within a power switching device in the unlatched and latched positions, respectively, in which an aspect of the present invention may be embodied.
Figure 3B:
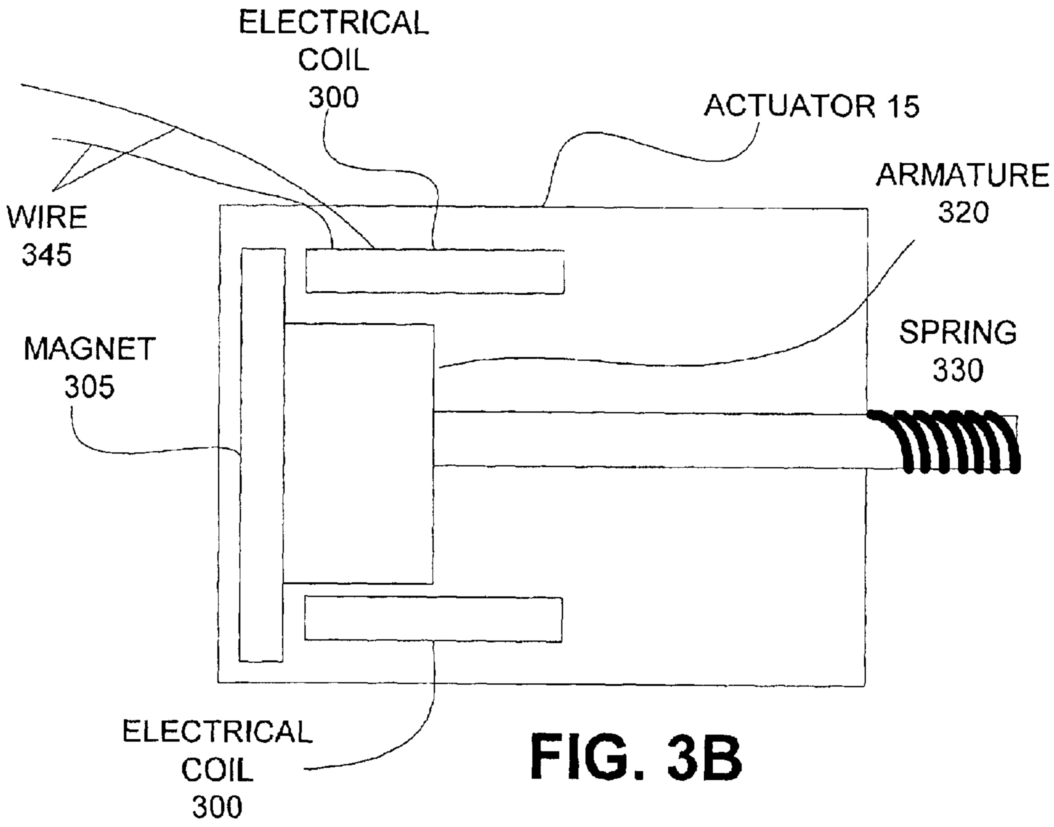

FIGS. 3A and 3B are block diagrams of a power switching device that may be controlled in accordance with the present invention. FIG. 3A shows magnetic actuator 15 in the unlatched position, i.e. the armature 320 is not between the magnetic actuator coils 300. The magnetic actuator 15 is held in the unlatched position by the open-spring 330. The latching motion of a magnetic actuator is accomplished, in accordance with the present invention, by applying a series of modulated current pulses through the magnetic actuator coils 300. As such, the current flow must be in the direction that reinforces the flux density of the permanent magnet 305. In other words, as the current flows, the coil 300 works in conjunction with the coil core (not shown) and housing (not shown) to form an electromagnet. The magnetic force of the electromagnet pulls the armature 320 toward the coil core. As the armature 320 moves toward the electromagnet, the open-spring 330 is compressed. The current flow through the coils 300 continues until the armature 320 seals i.e., when the armature 320 contacts the permanent magnet 305. Then, the current flow is stopped and the armature 320 is held in place by the permanent magnet 305. The magnetic actuator then remains in the latched position, as shown in FIG. 3B, until the magnetic actuator is unlatched.

Conversely, to unlatch the magnetic actuator, current is forced through the coils 300 in the direction that repels the flux of the permanent magnet 305. In this manner, as the amplitude of the current through the coil rises, the seal strength between the armature 320 and the permanent magnet 305 is weakened. The seal eventually weakens such that the force of the open-spring 330 will break the seal. Once the armature 320 is released, the open-spring 330 will then move the armature 320 to the unlatched position.

Figure 4:
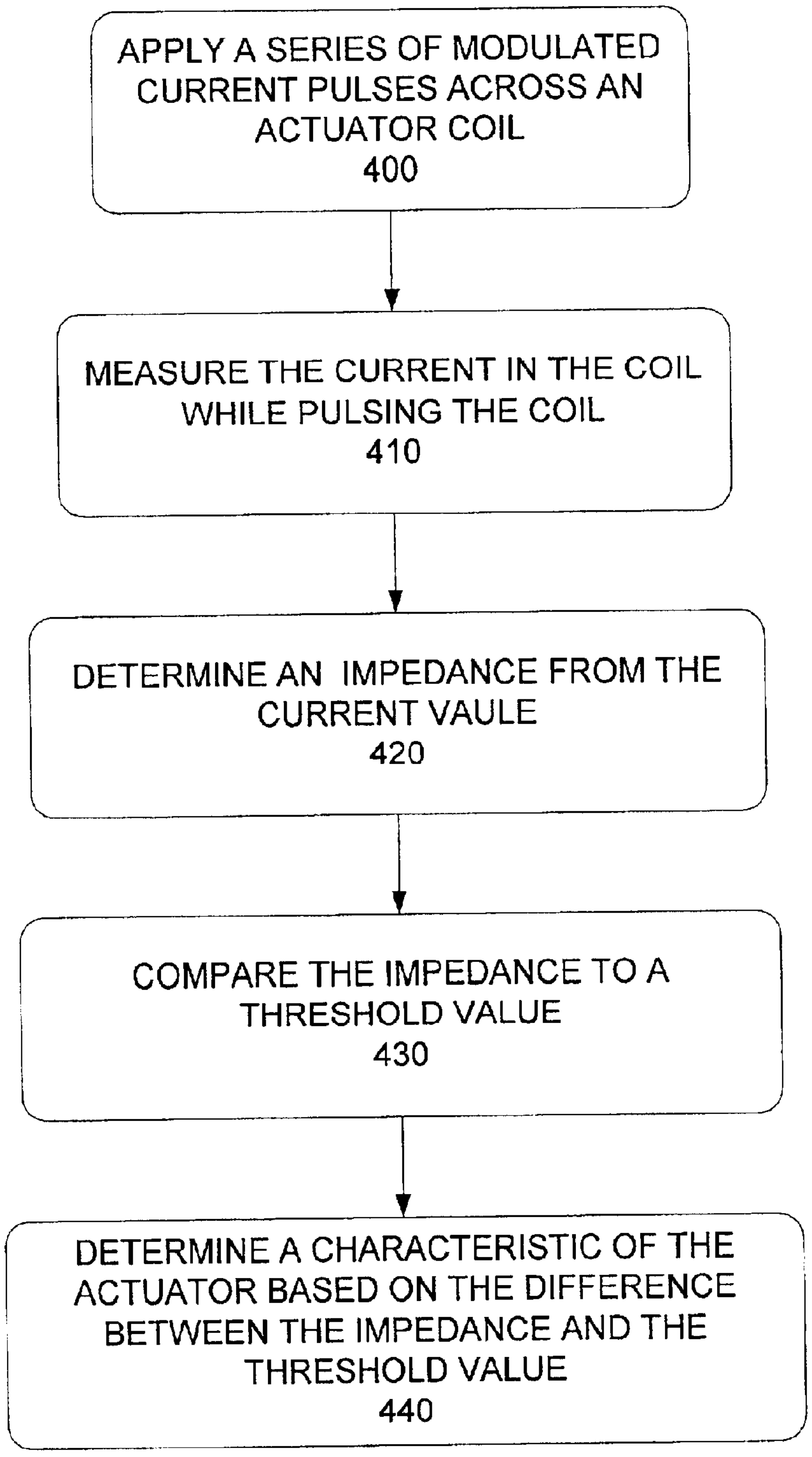
FIG. 4 is a flowchart of an exemplary method of ascertaining certain operating characteristics of an magnetic actuator in accordance with one embodiment of the present invention.

FIG. 4 is a flow chart of method in accordance with another embodiment of the present invention. In this embodiment, a method is used to ascertain certain operating characteristics of an magnetic actuator by measuring the inductance of the magnetic actuator coil.

In accordance with this embodiment of the present invention, a series of modulated current pulses are applied to a magnetic actuator coil for a predetermined interval of time at step 400. In one embodiment of the present invention, the duration of the voltage pulse is about 230 microseconds and the voltage driving the current is about 250VDC.

Then, at step 410, a current value is measured in the magnetic actuator coil during a portion of the predetermined interval of time. In one embodiment of the present invention, the current value is measured at about 200 microseconds.

The measured current amplitude is proportional to the impedance of the magnetic actuator's coil. As such, an impedance value is then determined from the measured current value at step 420. At step 430, the measured value is then compared to a predetermined threshold impedance value. Specifically, a difference is determined between the threshold value and the measured impedance. In another embodiment of the present invention, a deviation window may be used in conjunction with the threshold value to compensate for any manufacturing inconsistencies of the components of the magnetic actuator. The deviation window may be user defined and/or programmed into the magnetic actuator without departing from the present invention The threshold value may be user definable through software implemented in the power switching control device or may be flashed into the firmware of the controller without departing from the principles of the present invention. In one embodiment of the present invention, the controller stores the threshold value, and then compares the threshold value to the impedance.

At step 440, the result of the comparison between the threshold impedance value and the measured impedance value (i.e. the difference between the threshold value and the impedance) is used to establish certain operating characteristics of the magnetic actuator. For example, in accordance with the present invention, the comparison may be used to determine whether the magnetic actuator armature is in the latched or unlatched position, or the comparison may be used to determine the physical condition of the magnetic actuator coil.

Specifically, in one embodiment of the present invention, the power switching control device determines if the magnetic actuator armature is in the latched or unlatched position without the use of a sensor, such as a pole position sensor. Alternatively, the method may be used in conjunction with such a sensor to verify whether the sensor was accurate in determining whether the magnetic actuator armature is in the latched or unlatched position.

To determine the position of the magnetic actuator armature in accordance with the present invention, a series of modulated current pulses are applied through the magnetic actuator's coil at step 400. Then, the current is measured through the coil while the current pulses are being applied through the coil at step 410. At step 420, an impedance value of the magnetic actuator coil is determined from the measured current in the coil and compared to a threshold value. In one embodiment of the present invention, the threshold value is the impedance of coil with the armature in the unlatched position. In this manner, when the impedance of the coil with the armature in the unlatched position is compared to the threshold value, such impedances will be approximately the same or within a deviation or pass/fail window that can be determined by the user. Therefore, if the impedances are equal or fall within the deviation window, it is determined that the armature is in the unlatched position.

Alternatively, if the armature is in the latched position, the impedance will be larger than the impedance of the coil when the armature is in the unlatched position. In such a situation, the impedance of the coil is larger because, as illustrated in FIG. 3B, when the armature is latched, the armature is positioned below the magnetic actuator coil, and therefore the magnetic flux of the armature causes the impedance of the armature coil to be larger. Therefore, if the difference between the threshold value and the impedance value is larger than the deviation window, it is determined that the armature is in the latched position.

Figure 5A:
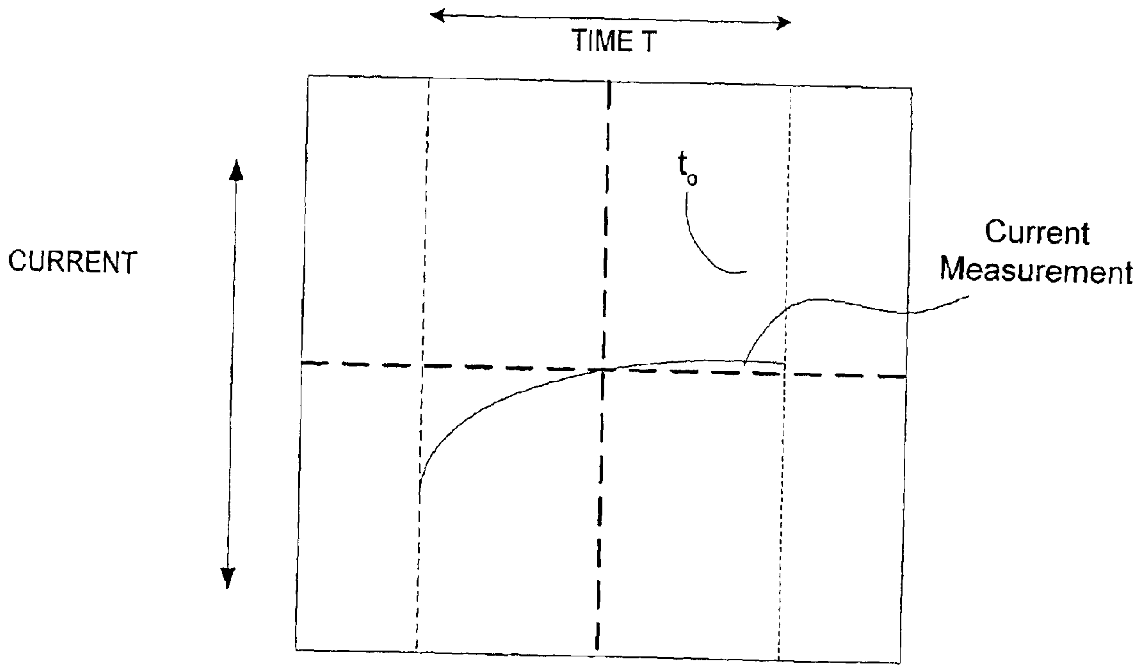
FIGS. 5A and 5B are exemplary plots useful in explaining how to determine the armature position of an magnetic actuator in accordance with one embodiment of the present invention.
Figure 5B:
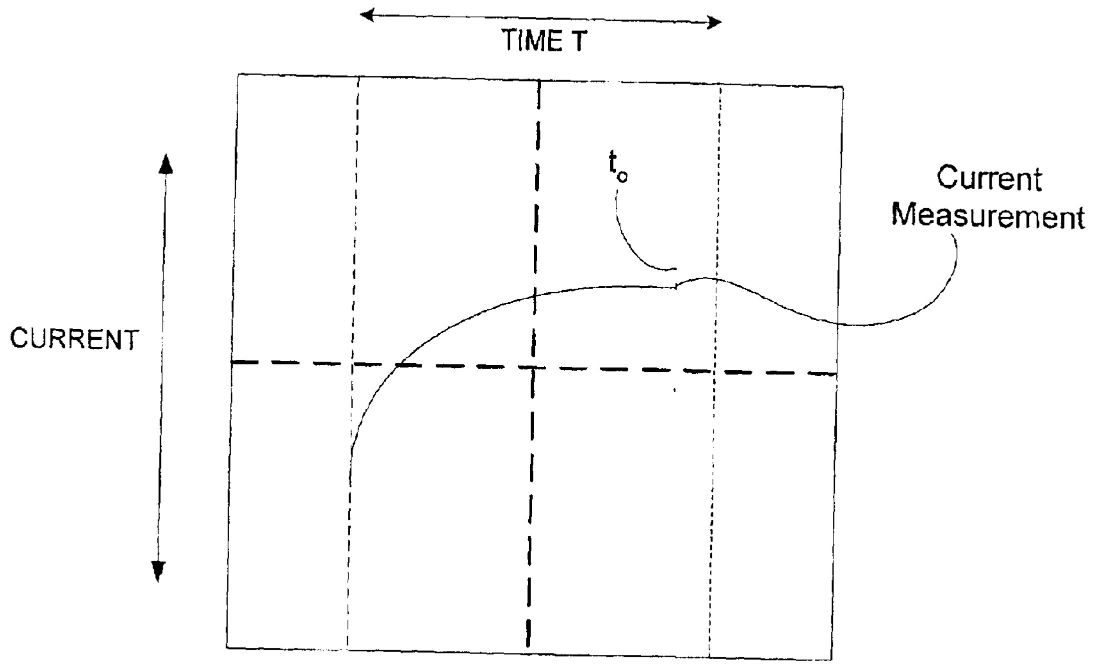

FIGS. 5A and 5B are exemplary plots of an impedance test to determine the armature position of a magnetic actuator in accordance with one embodiment of the present invention. In FIG. 5A, the magnetic actuator armature, which may be the magnetic actuator as shown in FIG. 3, is located in the latched position. As such, the slope of the current curve while the series of modulated current pulses is being applied is less than the slope of the curve in FIG. 5B because the armature (positioned below the coil) increases the impedance of the coil thereby reducing the amount of current passing through the coil. In one embodiment of the present invention, the current measurement ($t_0$) is taken at about 200 microseconds and the current, for example, is measured at a value of about 3.3 amps.

FIG. 5B is also an exemplary plot of an impedance test to determine the armature position of a magnetic actuator. In this plot, however, the magnetic actuator's armature is in the unlatched position. As such, the slope of the current curve during the 230-microsecond test period is much steeper than that of the current rise in FIG. 5A because the armature (not positioned below the coil) does not increase the impedance of the coil and, as such, the amount of current passing through the coil is larger than if the armature was positioned below the coil. In one embodiment of the present invention, the current measurement ($t_0$) is taken at about 200 microseconds and the current, for example, is measured at a value of about 5.5 amps.

As such, the user may define the threshold impedance value to correlate to, for example, about 4 amps. Consequently, any measured current value over about 4 amps will indicate the armature is in the unlatched position and any measured current value under about 4 amps will indicate the armature is in the latched position. Such a threshold value will preferably overcome substantially any measurement variations that arise from tolerance variations caused by inconsistencies in the manufacturing processes of the components of the power switching device. The threshold value, however, could be any value without departing from the principles of the present invention.

The present invention may be used as a stand-alone method for determining magnetic actuator positions, or it may used to complement a system having pole position sensors. In this manner, the present invention may serve to verify the results of the pole position sensors. In a situation where the present invention and pole position sensors are both used, both techniques would preferably agree on the position of each magnetic actuator or an alarm function would be activated. The use of two separate detection methods will increase the overall integrity of the power switching device system.

In another embodiment of the present invention, the physical condition of each magnetic actuator coil can be determined. As such, and in accordance with the present invention, a series of modulated current pulses is applied across the magnetic actuator's coil at step 400. Then, the current is measured through the coil while the current pulses are being applied to the coil at step 410. An impedance value is determined from the measured current value at step 420.

The impedance value is then compared to a threshold value at step 430 and based on this comparison, the physical condition of the magnetic actuator coil is determined. In this manner, the threshold value is the impedance of a coil in proper working order, e.g., a properly connected and non-corroded coil. In accordance with the present invention, if the impedance value calculated from the measured current at step 420 is larger than the threshold value, a condition exists in the coil which increases the coils impedance, e.g., a break in the coil winding or corrosion in the coil winding. On the other hand, if the impedance of the coil is smaller than the threshold value, a condition exists in the coil that decreases the coil's impedance, e.g., a short between the coil winding. As such, if the measured value equals the threshold value than the coil is in proper working condition.

Accordingly, in one embodiment of the present invention, if the impedance value of a coil is not within a predetermined deviation window of the threshold value than the power switching device controller may signal to an operator that such a coil is in a non-operable condition. The deviation window may be user defined and/or programmed into the power switching device controller without departing from the present invention. Consequently, by comparing the impedance of the magnetic actuator coil in accordance with the present invention, the physical condition of a magnetic actuator coil may be determined.

The present invention also provides a power switching device control device having an improved energy management system therein. In this manner, the power switching control device includes an energy management system having a voltage regulator that has the ability to operate in and switch between operating modes. In one embodiment, the regulator is a 15 VDC regulator. As such, the 15 VDC regulator may receive a 250 VDC input signal and output a 15 VDC signal, for example, such 15 VDC output signal may be used as input for 5 VDC regulator that powers a CPU within the power switching device controller.

The regulator, in accordance with the present invention, may operate in a linear mode, a switching mode or in both modes simultaneously. The regulator may, for example, change modes upon instruction from a CPU or by regulator output loading. Regulator output loading occurs when external conditions require the regulator to output more power. During regulator output loading, the regulator may not necessarily fully switch from one mode to another, but in fact may operate in both modes to meet the desired loading.

Figure 6A:
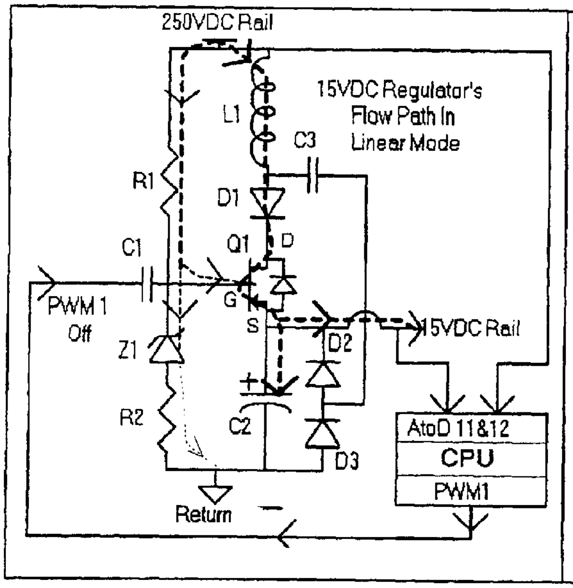
FIGS. 6A and 6B are schematic circuit diagrams of an exemplary voltage regulator operating in two different modes, respectively, in accordance with the present invention.

In linear mode, or stand alone mode, the regulator operates without control from the controller's CPU and may generate a higher output with a lower efficiency. FIG. 6A is a simplified schematic of a voltage regulator, in accordance with the present invention, operating in linear mode. In this regard, the dotted lines represent the current flow when the regulator is operating in linear mode. As such, the regulation voltage for the 15 VDC rail is set by the forward voltage drop of zener diode Z1. The regulated voltage will be approximately 5 volts greater than the forward voltage drop of zener diode Z1. The regulation value will be the zener diode Z1 forward voltage drop plus FET Q1's minimum gate (G) to source (S) turn-on voltage. The current path that feeds zener diode Z1 is from the 250 VDC rail through resistor R1. The exit path from zener diode Z1 is through resistor R2 to the Return. Resistor R1 is set to a value preferably greater than about 100 K ohms and resistor R2 is about 1 K ohm. Inductor L1 and diode D1 act as conductors. The voltage on the drain (D) of FET Q1 is about the same as the voltage on the 250 VDC rail. The amount of current that is allowed to flow through FET Q1 and into the 15 VDC rail is controlled by the voltage drop between FET Q1's gate (G) and FET Q1's source (S). When the voltage on the 15 VDC rail rises, the voltage difference between the gate and source will become less. The gate voltage will remain constant. When this voltage difference becomes less than about 5 volts, the current flow through FET Q1 will be decreased.

Figure 6B:
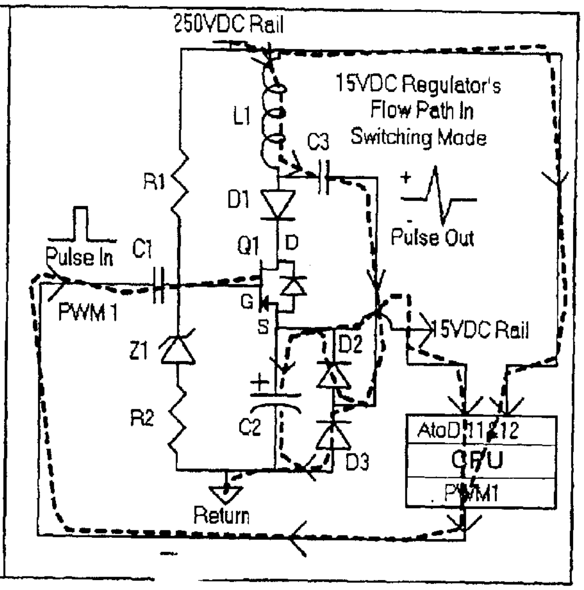

In switching mode, however, the regulator operates with a greater efficiency than in linear mode. FIG. 6B is a simplified schematic of a voltage regulator, in accordance with the present invention, operating in switching mode. As such, the dotted lines represent the current-flow through the regulator while operating in switching mode. First, the CPU through PWM1 pulses FET Q1's gate. A pulse into the gate of FET Q1 will cause FET Q1 to conduct for duration of the pulse. During this duration, current starts to flow through inductor L1; then the pulse's falling edge switches off FET Q1 and the current flows through inductor L1. The current pulse through inductor L1 causes inductor L1 to "ring" or oscillate. These oscillations are rectified through diode D1 and diode D2 into the 15 VDC rail. Capacitor C3 blocks the 250 VDC rail, allowing only the AC component of the oscillations to be rectified. The pulse width of PWM 1 is narrow, so the oscillations of inductor L1 have low amplitudes. The low amplitudes reduce noise radiation into the surrounding circuits (not shown). Diode D1 helps to prevent the damping of the oscillations by blocking FET Q1's internal capacitance, and blocks the conductive path of FET Q1's parasitic diode. Inductor L1's oscillations are very narrow; therefore one desirable characteristic of diode D1 and diode D2 is that they have a fast reverse recovery time (e.g., less than 35 nanoseconds). The voltage on the 15 VDC rail is digitized by analog to digital converter 12 and the value passed to the CPU. The CPU uses the digitized voltage values of the 15 VDC and 250 VDC rails to determine whether PWM1 should be switched on or off. These digitized values are also used to adjust both the duration and frequency of PWM1's pulses. The regulation voltage in switching mode, for example, may be set by the power switching device control device's firmware to about 15 VDC. This is about 3 volts higher than when in linear mode. Therefore, when in switching-mode FET Q1 is biased off except when pulsed by PWM1.

There are, however, situations where the CPU cannot control the voltage regulation function i.e. operate in switching mode. For example, the CPU cannot regulate voltage prior to being powered on or when temporarily malfunctioning. In these situations, the regulator operates in the less efficient linear or stand alone mode to regulate the voltage and then may switch to switching mode.

Additionally, the regulator, in accordance with the present invention, may switch from switching mode to linear mode or vice versa if circuitry downstream from the regulator requires more current due to an unexpected voltage dip, for example. In this manner, for example, the regulator may be operating in switching mode and, may temporarily switch to linear mode, and as such, may dissipate a larger burst of regulated power in order to compensate for the downstream voltage dip. For example, a regulator, in accordance with the present invention, may output 0.4 amps. The regulator load, however, may temporarily require 0.8 amps and, as such, the regulator would desirably operate in linear mode and switching mode until a balanced is reached whereby the regulator delivers the power needed.

In this regard, the regulator has the ability to regulate as much power as the regulator can thermally dissipate while regulating the power. In one embodiment, the thermal energy that is dissipated will vary according to the voltage difference between a voltage source, the regulated voltage and the amount of current passing through the regulator. As such, the power dissipated (wattage) is the voltage drop between the source voltage and the regulated voltage times the current flowing through the regulator or (P=E*I).

As such, the regulator may operate in switching mode during normal operation, however, has the ability to switch to linear mode and supply additional power when needed. Consequently, by having the ability to switch between modes, the regulator may provide additional power, when desirable, then switch to a more efficient mode when additional power is not needed. For example, in one embodiment of the present invention, a power switching device control device, with a regulator operating in linear mode, uses about 0.2 amps from the regulator with a source voltage of about 250 VDC and a regulated voltage of about 12 VDC. Therefore, using the equation above, the power is about 47.6 watts and represents the amount of wasted heat energy. On the other hand, with a regulator in switching mode, the power switching device control device uses 0.2 amps at 15 VDC, and using the equation above, the power loss is 4 watts.

Additionally, according to aspects of the present invention, the regulator may operate in both modes simultaneously when switching from one mode to another. In this manner, if the regulator is transitioning from one mode to another, the regulated output power will be derived from both modes of operations. Alternatively, in one embodiment of the present invention, if more downstream current is needed, the regulator, while operating in switching mode, may partially operate in linear to provide the needed current downstream. For example, if the regulator is set to regulate 12 VDC in linear mode and 15 VDC in switching mode and the desired output voltage is 13 VDC, most of the power will be derived from linear mode while a portion will be derived from switching mode. In yet another embodiment of the present invention, even while operating at 15 VDC in full switching mode, the regulator may still derive a portion of the output current from linear mode.

Portions of the invention may be embodied in the form of appropriate computer software, or in the form of appropriate hardware or a combination of appropriate hardware and software without departing from the spirit and scope of the present invention. Further details regarding such hardware and/or software should be apparent to the relevant general public. Accordingly, further descriptions of such hardware and/or software herein are not believed to be necessary.

Although illustrated and described herein with reference to certain specific embodiments, the present invention is nevertheless not intended to be limited to the details shown.

Rather, various modifications may be made in the details within the scope and range of equivalents of the claims and without departing from the invention.

What is claimed is:

1. A method for controlling a magnetic actuator having a coil and an armature within a power switching device, the actuator being connected to a power line in a high voltage electrical distribution system, the method comprising:

inputting a power signal;

applying a first series of modulated current pulses having a first magnitude through the coil of the magnetic actuator connected to the power line in the high voltage electrical distribution system;

using current information from the magnetic actuator to modify the first magnitude of the first series of modulated current pulses; and applying a second series of modulated current pulses having a second magnitude through the coil of the magnetic actuator connected to the power line in the high voltage electrical distribution system in a first direction such that the actuator moves from a first position to a second position.

2. The method of claim 1 further comprising:

applying a series of modulated current pulses through the coil of the magnetic actuator in a second direction such that the actuator moves from the second position to a third position.

3. The method of claim 2 wherein the third position is the first position.

4. The method of claim 1 further comprising:

measuring a current value in the coil while pulsing the coil; and comparing the current value with a threshold value.

5. The method of claim 4 further comprising:

determining, based on the comparison, whether to continue applying a series of modulated current pulses through the coil of the magnetic actuator in a first direction such that the actuator moves from a first position to a second position.

6. The method of claim 1 wherein tuning the current pulse comprises changing the amplitude and duration of at least one of the modulated current pulses.

7. A power switching control device for controlling a magnetic actuator within a power switching device connectable to a power line in a high voltage electrical distribution system, the control device comprising:

a power supply;

at least one actuator drive circuit adapted to provide a series of modulated current pulses to the magnetic actuator, the actuator being connectable to the power line in the high voltage electrical distribution system within the power switching device; and a microprocessor for using current information from the magnetic actuator to monitor the series of modulated current pulses to determine whether to modify the magnitude of the modulated current pulses.

8. The power switching control device of claim 7 wherein the control device has a low setting, a medium setting and a high setting for the tunable current pulses.

9. The power switching control device of claim 7 wherein the power switching control device is a recloser controller and the power switching control device is a recloser.

10. The power switching control device of claim 7 wherein the power supply is a direct current power supply.

11. The power switching control device of claim 7 wherein the power supply is an alternating current power supply.

12. The power switching control device of claim 7 wherein the power switching control device comprises three actuator control circuits.

13. The power switching control device of claim 7 wherein the power supply is programmable between 150 and 250 VDC.

14. The power switching control device of claim 7 further comprising:

a controller housing; and an energy storage capacitor contained within the controller housing for storing the energy to be delivered to the magnetic actuator.

15. A power switching device system comprising:

a power switching device having a magnetic actuator connectable to a power line in a high voltage electrical distribution system including a coil and an armature;

a power switching device controller adapted to apply a voltage across the coil for a predetermined interval of time, measure a current value in the coil during a portion of the predetermined interval of time, determine an impedance value for the coil based on the current value, compare the impedance value for the coil to a threshold impedance value for the coil and determine, based on the comparison, a characteristic of the magnetic actuator;

a microprocessor for monitoring a series of modulated current pulses applied to the magnetic actuator to determine whether to modify the magnitude of the modulated current pulses; and at least one actuator drive circuit adapted to provide a series of modulated current pulses to the magnetic actuator.

16. The power switching device system of claim 15, wherein the characteristic of the magnetic actuator is the position of the armature in the magnetic actuator.

17. The power switching device system of claim 15, wherein the characteristic of the magnetic actuator is the condition of the coil.

18. The power switching device system of claim 15, wherein the power switching device controller comprises:

memory for storing data;

a microprocessor; and a voltage regulator electrically connected to the microprocessor, the voltage regulator adapted to switch between a linear mode and a switching mode.

* * * * *